United States Patent [19]

Niki et al.

[11] 4,272,719
[45] Jun. 9, 1981

[54] ELECTRIC FIELD INTENSITY MEASURING APPARATUS

[75] Inventors: Shoji Niki, Saitama; Yuji Yoshino, Gyoda, both of Japan

[73] Assignee: Takeda Riken Kogyo Kabushikikaisha, Tokyo, Japan

[21] Appl. No.: 14,568

[22] Filed: Feb. 23, 1979

[30] Foreign Application Priority Data

Feb. 27, 1978 [JP] Japan ................................. 53/20916

[51] Int. Cl.³ ............................................. G01R 31/02
[52] U.S. Cl. ..................................... 324/72; 324/79 R
[58] Field of Search .................. 324/72, 73 AT, 77 B, 324/79 R, 79 D, 121 R, 140, 77 G

[56] References Cited

U.S. PATENT DOCUMENTS

3,761,803  9/1973  Slough ..................... 324/72
3,879,661  4/1975  Collins ..................... 324/77 B Primary Examiner—David K. Moore
Attorney, Agent, or Firm—Staas & Halsey

[57] ABSTRACT

An input signal from an antenna is level-adjusted by a first level adjuster and then frequency-converted by a frequency converter. The frequency-converted signal is further level-adjusted by a second level adjuster and then detected by a detector, and the detected output is displayed on a first display. A control signal for controlling the frequency of a local oscillation signal of a local oscillator, which is applied to the frequency converter, is adjusted to select the input signal to be measured. The control signal is applied to a compensating signal generator to derive therefrom a compensating signal for compensating for the frequency characteristic of the antenna. The compensating signal, a first set signal representing the set value of the first level adjuster, and a second set signal representing the set value of the second level adjuster are added together. The added output is applied to a second display to indicate the antenna input value provided at the time when the first display indicates a reference level of the first display, thus measuring the electric field intensity of the input electric wave.

25 Claims, 7 Drawing Figures

ELECTRIC FIELD INTENSITY MEASURING APPARATUS

BACKGROUND OF THE INVENTION

This invention relates to an apparatus for measuring the electric field intensity of an electric wave, such as a signal wave, a noise wave or the like, and more particularly to an electric field measuring apparatus which is simple in manipulation.

In a conventional electric field intensity measuring apparatus, the input side of a receiver is connected first to the side of an antenna, the oscillation frequency of a local oscillator is manually controlled to select an electric wave to be measured, the attenuation of a high-frequency attenuator and the gain of an intermediate-frequency variable gain amplifier are adjusted so that the received detected output of the selected electric wave is indicated in a predetermined proper value by an indicator, and the set values of these level adjusters are read out. Then, the receiver input side is switched from the antenna to the output side of a reference oscillator and, at the same time, the reference oscillator is caused to oscillate at the same frequency as that of the electric wave to be measured. The oscillator output is predetermined. This oscillator output is similarly level-adjusted to cause the indicator to provide an indication of the predetermined value of the oscillator output, and the set values of the level adjusters at this time are read out. Further, a coefficient for compensating for the frequency characteristic of the antenna is read out, for example, from a graph relating such coefficients to the frequency of the electric wave to be measured. Based on this coefficient, the abovesaid two level set values, and the output from the reference oscillator, the electric field intensity of the electric wave to be measured is obtained.

As described above, the conventional electric field intensity measuring apparatus is troublesome in manipulation. Moreover, since the coefficient for compensating for the frequency characteristic of the antenna differs with the various frequencies of electric waves to be measured, compensating coefficients are prepared in the form of a graph and selectively read out therefrom for each measurement of the electric field intensity.

There has also been proposed a measuring equipment designed for measuring the electric field intensities of both a continuous wave and a noise wave. The measurement of the noise wave is generally rated, and a detector is set to have a quasi-peak value detecting mode of operation. For measurement of the continuous wave, as opposed to a noise wave, the detector is switched to a mean value detecting mode of operation to detect an envelope of an intermediate-frequency carrier. In the case of the quasi-peak value detection, the envelope is converted to direct current form, that is, averaged to some extent, so that when the detector is changed over to the quasi-peak value detecting mode, the detected output decreases as compared with that in the case of the mean value detecting mode. Accordingly, when the detector is switched to the mean value detection mode from the quasi-peak value detection mode, in which the detected output has a reference value, that is, the indicator indicates its maximum scale value, the mean value detected output increases, resulting in the indicator "scaling over". Therefore, in order to obtain the detected output at a predetermined reference level, it is necessary that each stage preceding the detector be used at a level lower than a maximum level permissible for that stage.

In the quasi-peak value detection mode, the detected output is smaller than that in the mean value detection mode, for example, by about 40 dB. As a result of this, the measuring range, i.e. the dynamic range of measurement decreases approximately 40 dB as compared with that in the case of no noise wave being measured. In other words, it is impossible to make full use of the permissible level range of each stage preceding the detector.

It is an object of this invention to provide an electric field intensity measuring apparatus which is very simple in manipulation but capable of accurate measurement.

It is another object of this invention to provide an electric field intensity measuring apparatus which enables the full use of allowed levels of stages preceding the detector to the maximum extent possible in the measurement of the field intensities of both of a noise wave and a continuous wave, and which provides a wide dynamic range of measurement.

SUMMARY OF THE INVENTION

In accordance with this invention, an input signal to be measured from an antenna is level adjusted by a first level adjuster and then frequency mixed by a frequency converter with a local oscillation signal fed thereto from a variable frequency local oscillator. The frequency converted output thus obtained is further level adjusted by a second level adjuster, the output from which is then detected by a detector, and the magnitude of the detector output is displayed on a first display. The oscillation frequency of the variable frequency oscillator is controlled by a control signal from a control signal generator. The control signal corresponds in magnitude to the frequency of the input signal to be measured and is also provided to a compensating signal generator to derive therefrom a compensating signal corresponding to the frequency characteristic of the antenna. A first set signal indicating the set value of the first level adjuster is provided from a first set signal generator and a second set signal indicating the set value of the second level adjuster is yielded from a second set signal generator. These first and second set signals and the aforesaid compensating signal are added together by an adder for input to a second display. The second display is previously calibrated so that it indicates the input signal level when the first display indicates a reference level, for example, its maximum scale value.

With such an arrangement, the electric wave to be measured is received by adjusting the oscillation frequency of the local oscillator and the first and second level adjusters are adjusted so that the display on the first display becomes the reference level, by which the electric field intensity of the received electric wave is displayed on the second display. A cathode ray tube display i.e., the so-called CRT display, is employed as the first display, and the output from a sawtooth signal generator is applied as a control signal to the variable frequency local oscillator to automatically change its oscillation frequency. At the same time, the control signal is also provided to the CRT display to achieve its horizontal sweep, and the detector output is applied to the CRT tube to perform its vertical deflection. Thus, the received input signal frequency is automatically changed without the necessity of manually changing the frequency of the variable frequency local oscillator, and the level of the input signal from the antenna can be read out from the scale on the abscissa of the CRT display. The reference value of the scale is displayed as an antenna input value on the second display. In this case, if the level adjusters are adjusted so that the peak value of the displayed waveform coincides with the reference level of the CRT display, the value displayed by the second display comes to indicate the input signal level. Further, in this instance, the frequency spectrum of the received input signal is displayed on the CRT display; namely, a so-called panoramic display is provided, and the frequency components of the input signal can also be observed at the same time. With such an arrangement, it is possible to employ the apparatus of this invention not only as an instrument for measurement of electric field intensity, but also as a frequency spectrum analyzer.

Where an auxiliary amplifier is provided at a stage following the frequency converter for measuring the electric field intensity of a noise wave, the detector output is applied via the auxiliary amplifier to the first display. An overload amplifier is employed as the auxiliary amplifier, and its gain is selected to be larger than the overload factor of the stage preceding the detector in the case of the detector being set for the quasi-peak value detection. With such an arrangement, also in the case of the mean value detection mode for measuring the electric field intensity of a continuous electric wave, the stage preceding the detector can be actuated up to its maximum permissible level, by which a wide dynamic range of measurement can be achieved.

DESCRIPTION OF THE PREFERRED EMBODIMENTS

To facilitate a better understanding of this invention, a description will be given first of a conventional electric field intensity measuring apparatus with reference to FIG. 1. An electric wave received by an antenna 11 is supplied via a changeover switch 12 to a high-frequency variable attenuator 13 for level adjustment. The output from the variable attenuator 13 is provided via a high-frequency amplifier 14 to a frequency converter 15, in which it is frequency mixed with a local oscillation signal supplied from a variable frequency local oscillator 16. The output from the frequency converter 16 is amplified by an intermediate-frequency amplifier 17 and its level is adjusted by an intermediate-frequency variable gain amplifier 18, whose output is supplied to a detector 19. The output from the detector 19 is applied to a display 21 to indicate the magnitude of the detector output. In the case of measuring a continuous wave, a detecting characteristic changeover knob 22 is set to a mean value detecting position M to set the detecting characteristic of the detector 19 for the mean value detection. In the case of measuring a noise wave, the knob 22 is changed over to a quasi-peak value detecting position Q to set the detecting characteristic of the detector 19 for the quasi-peak-value detection.

With the above arrangement of the prior art, in the case of measuring the electric field intensity of an electric wave to be measured, the oscillation frequency of the local oscillator 16 is changed to a frequency for receiving from the antenna 11 the electric wave to be measured. The attenuation of the high-frequency variable attenuator 13 and the gain of the intermediate-frequency variable gain amplifier 18 are respectively adjusted so that the indication by the display 21 at that time may have a predetermined value. Let the overall attenuation at that time be represented by $L_1$ dB.

Then, the changeover switch 12 is connected to the side of a reference oscillator 23 to adjust it to oscillate at the frequency of the wave to be measured. A reference oscillation signal of a predetermined level $V_C$ derived from the reference oscillator 23, is provided via the switch 12 to the variable attenuator 13. As is the case with the above, the reference oscillation signal is frequency converted by the frequency converter 15 and detected by the detector 19, thereafter being applied to the display 21. The variable attenuator 13 and the variable gain amplifier 18 are respectively adjusted so that the indication on the display 21 may agree with the aforesaid predetermined value. Let the overall attenuation at this time be represented by $L_2$ dB.

Letting K represent the coefficient of compensation relative to the frequency of the received wave to be measured in the frequency characteristic of the antenna 11, the electric field intensity E of the wave to be measured is given as follows:

$$E = V_C + L_1 - L_2 + K$$

Figure 2:
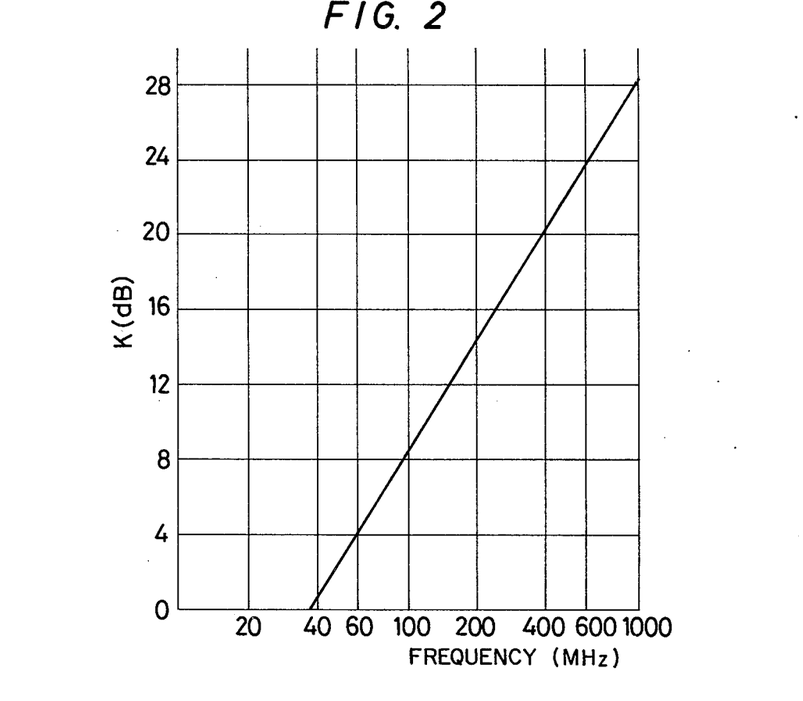
FIG. 2 is a graph showing a frequency characteristic indicating a coefficient of compensation relative to the frequency characteristic of a half-wavelength dipole antenna.

The coefficient of compensation K of the antenna, for example, in the case of the antenna being a dipole antenna, linearly increases relative to the logarithmic frequency as the frequency of the received wave increases as shown in FIG. 2.

As described above, in the conventional electric field intensity measuring apparatus, the selection of the received frequency, the level adjustment of the received signal, the changeover of the switch 12, the frequency adjustment of the reference oscillator 23, and the level adjustment of the oscillator output are sequentially achieved, and then the electric field intensity E is obtained by calculation from the set values $L_1$ and $L_2$, obtained by the above operations, and the coefficient of compensation is read from the graph of FIG. 2 based on the frequency measured and the output $V_C$ from the reference oscillator 23. Therefore, the prior art apparatus is troublesome in operation and requires much time for measurement.

For measuring the electric field intensity of a noise, the detecting characteristic changeover knob 22 is changed to the position Q from the position M for setting the detector 19 to assume the quasi-peak value detecting mode of operation. The quasi-peak value detected output is lower in level than in the case of the mean value detection. Accordingly, if the display 21 is adapted to deflect to full span in the quasi-peak value detection mode, the overload factor of the stage preceding the detector 19 is required to be, for instance, about 40 dB. In the case where the detector 19 is set for the mean value detection in the measurement of a continuous wave, the display 21 deflects to the maximum when supplied with a level lower, by 40 dB, than a maximum allowable level of each stage preceding the detector 19. Therefore, in the measurement of the continuous wave, the maximum allowable level of each stage preceding the detector 19 is not effectively used, resulting in the defect that the measurable input level range, that is, the dynamic range of measurement, becomes narrow.

Figure 1:
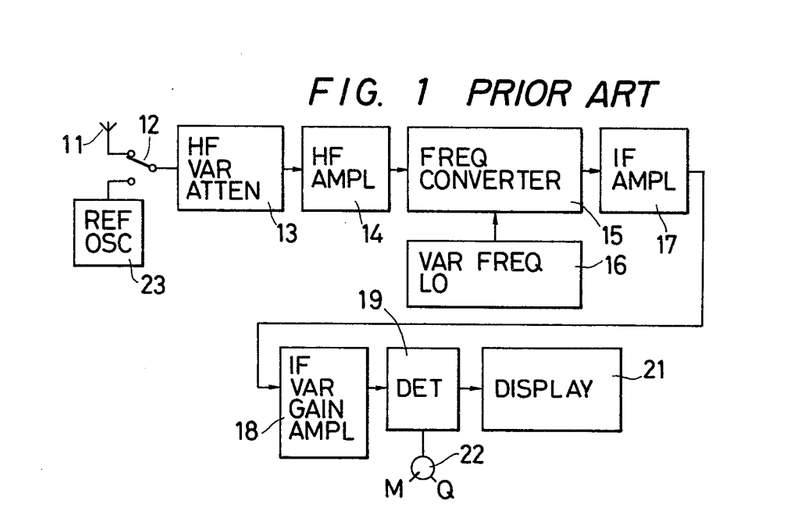
FIG. 1 is a block diagram illustrating a conventional electric field intensity measuring apparatus.
Figure 3:
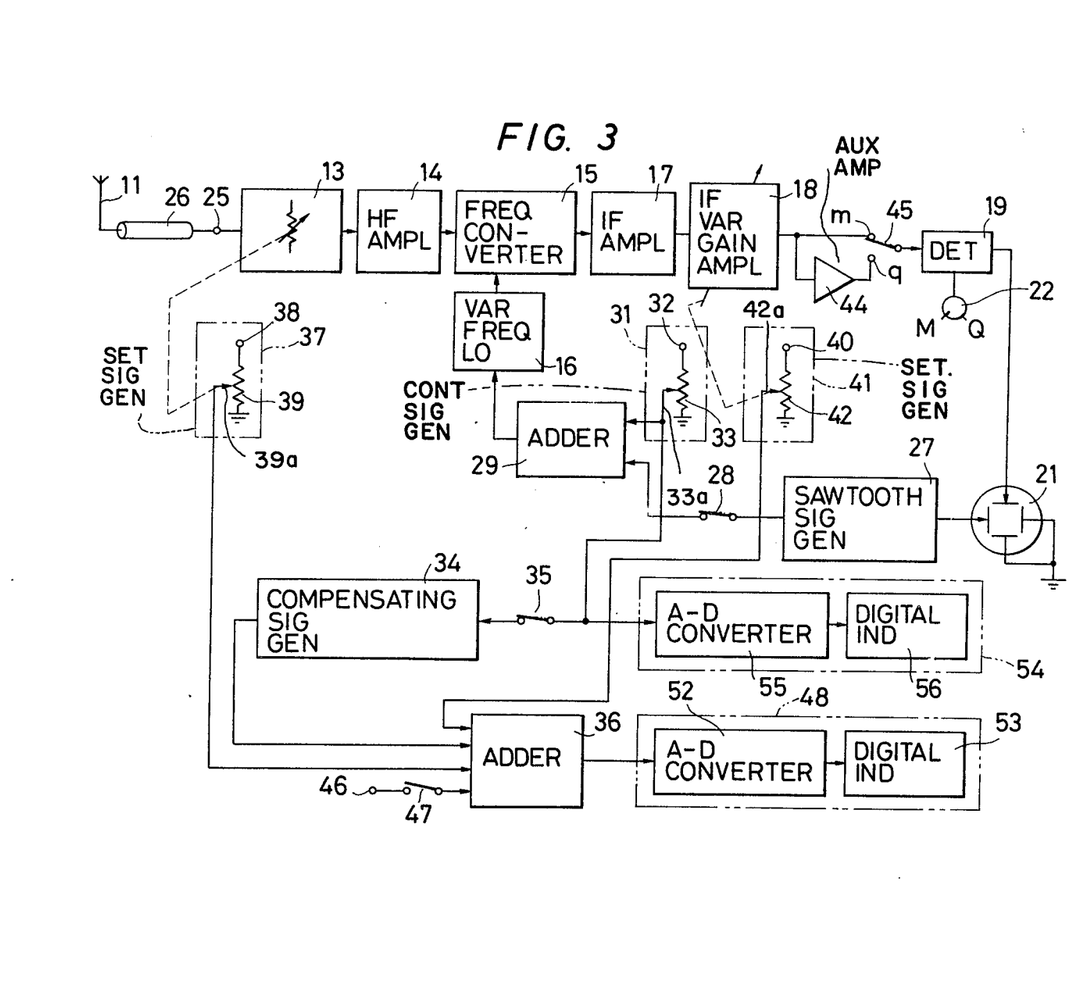
FIG. 3 is a block diagram illustrating an embodiment of an electric field intensity measuring apparatus of this invention.

FIG. 3 illustrates an embodiment of an electric field intensity measuring apparatus of this invention, in which parts corresponding to those in FIG. 1 are identified by the same reference numerals. The illustrated electric field intensity measuring apparatus is designed so that it may also be used as a frequency spectrum analyzer. Accordingly, the input side of the high-frequency variable attenuator 13 can be disconnected by a connector 25 from the side of the antenna 11. In FIG. 3, the antenna 11 and the high-frequency attenuator 13 are shown to be interconnected via a cable 26.

As a first display 21, a cathode ray tube display (i.e. the so-called CRT display) is employed, and for its horizontal deflection a sawtooth signal generator 27 is provided. The sawtooth signal generator 27 is also connected via a switch 28 to an adder circuit 29. To the adder circuit 29, a control signal from a control signal generator 31 is also applied, this control signal is added to the signal from the sawtooth signal generator 27, and the added output is supplied to a frequency control terminal of the variable frequency local oscillator 16. The control signal generator 31 is formed, for instance, by connecting a variable resistor 33 between a terminal 32 supplied with a negative constant voltage and the ground, and a control signal derived at the movable member 33a of the variable resistor 33 is provided to the adder circuit 29. In accordance with the magnitude of the control signal, the oscillation frequency of the local oscillator 16 for the center of horizontal sweep of the CRT display 21, that is, the center of a sweep frequency, is determined.

The control signal from the control signal generator 31 is also branched to a compensating signal generator 34. That is, the movable member 33a of the variable resistor 33 is connected via a switch 35 to the input side of the compensating signal generator 34. The compensating signal generator 34 generates a signal for compensating for the frequency characteristic of the antenna 11, that is, a signal corresponding to the coefficient of compensation K shown in FIG. 2. Where a half-wavelength dipole antenna is used as the antenna 11, the compensating signal generator 34 may be a logarithmic amplifier which exhibits a logarithmic input/output characteristic. The output from the compensating signal generator 34 is applied to an adder 36.

The adder 36 is also supplied with a set signal indicating the amount of level control for the signal to be supplied to the display 21. In this embodiment, the level of the signal supplied to the display 21 can be altered by respectively adjusting the attenuation of the high-frequency variable attenuator 13 and the gain of the intermediate-frequency variable gain amplifier 18. A set signal generator 37 is provided in correspondence to the high-frequency variable attenuator 13. In the set signal generator 37, for example, a variable resistor 39 is connected between a terminal 38 supplied with a positive constant voltage and the ground, and a movable member 39a of the variable resistor 39 is ganged with a knob for adjusting the attenuation of the variable attenuator 13. From the movable member 39a of the variable resistor 39, a signal indicating the set value of the variable attenuator 13 is derived to be supplied to the adder 36.

Similarly, a set signal generator 41 is provided in correspondence to the variable gain amplifier 18. In the set signal generator 41, for example, a variable resistor 42 is connected between a terminal 40 supplied with a positive constant voltage and the ground, and a movable member 42a of the variable resistor 42 is ganged with a knob for adjusting the gain of the variable gain amplifier 18. From the movable member 42a of the variable resistor 42, a signal representing the gain set value of the variable gain amplifier 18 is obtained to be applied to the adder 36.

This embodiment is designed so that the electric field intensity of a noise wave can also be measured, and so that, in the case of measuring the electric field intensity of a continuous wave, the stage preceding the detector 19 can be effectively used to its maximum allowable level. That is, an auxiliary amplifier 44 is provided and its input side is connected to the output side of the variable gain amplifier 18. The input side of the detector 19 is adapted to be selectively connectable with the output sides of the variable gain amplifier 18 and the auxiliary amplifier 44, respectively, via contacts m and q respectively of a changeover switch 45. The auxiliary amplifier 44 is an overload amplifier. The gain of the auxiliary amplifier 44 is selected larger than the overload factor which is required of the stage preceding the detector 19 in the case where the auxiliary amplifier 44 is not actuated, and the detector 19 is set for the quasi-peak value detection. That is, when the overload factor is 40 dB, the gain of the auxiliary amplifier 44 is selected larger than 40 dB. Where the changeover switch 45 is connected to the auxiliary amplifier 44, a signal representing the gain of the auxiliary amplifier 44 is provided via the switch 47 to the adder 36 from the terminal 46, thereby compensating in the reference level indication, for the insertion of the auxiliary amplifier 44.

Figure 4:
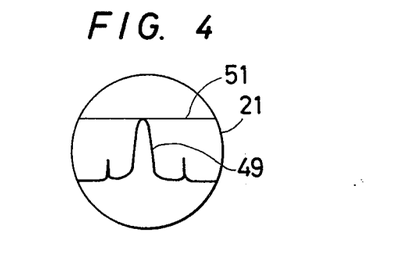
FIG. 4 is a diagram showing an example of a display on a screen of a CRT display used as a first display 21 of FIG. 3.

The output from the adder 36 is supplied to the second display 48. The second display 48 indicates an antenna input level corresponding to the reference level of the first display 21. For example, referring to FIG. 4, such reference level may be represented, in the case of a CRT display, by a maximum scale value corresponding to a predetermined value on the ordinate, such as the maximum "graduation" 51 (as seen in FIG. 4).

Since the variable attenuator 13 is to decrease the level of the signal to be supplied to the first display 21, if the input level of the first display 21 is held constant, the larger the attenuation of the attenuator 13 is, the higher the level of the antenna input becomes. Accordingly, the output from the set signal generator 37, representing the attenuation of the variable attenuator 13, is applied as a positive input to the adder 36. Since the variable gain amplifier 18 is intended to raise the level of the signal supplied to the first display 21, if the input level of the first display 21 is held constant, the larger the gain of the variable gain amplifier 18 is, the lower the level of the antenna input becomes. Accordingly, the set signal from the set signal generator 41, representing the gain of the variable gain amplifier 18, becomes negative. Similarly, the signal provided to the terminal 46, indicating the gain of the auxiliary amplifier 44, is also applied as a negative input to the adder 36.

The added value indicating the set value of each of the variable attenuator 13 and the variable gain amplifier 18 is provided to the second display 48. The second display 48 is so calibrated as to display the level of the antenna input, i.e., the electric field intensity of the wave to be measured, when the display on the first display 21 reaches a reference value, for example, when the variable attenuator 13 and the variable gain amplifier 18 are set so that the peak value of a waveform 49 (FIG. 4) displayed on the screen of the CRT display 21 reaches the reference level 51. The second display 48 is arranged such that, for instance, when the output from the adder 36 appears as a DC voltage, it is converted by an A-D converter 52 to a digital signal for indication on a digital display 53.

In order that the frequency of the received wave may be measured, in this embodiment, the signal derived from the control signal generator 31 is also branched to a frequency measuring device 54. The frequency measuring device 54 is designed so that, for example, the output voltage from the control signal generator 31 is converted by an A-D converter 55 to a digital signal for indication as a frequency on a digital indicator 56. That is, by adjusting the control signal generator 31, the waveform 49 (FIG. 4) on the CRT display 21 is positioned at the center of the abscissa of the screen. The output control signal derived from the control signal generator 31 at that time corresponds to the oscillation frequency of the local oscillator 16, and this frequency corresponds to the frequency of the received wave. Accordingly, by previously calibrating the digital display 56 in such a manner as to indicate the relationship between the level of the control signal from the control signal generator 31 and the frequency of the received wave, it is possible to indicate the frequency of the received wave on the display 56.

With the arrangement described above, for measuring the electric field intensity of an electric wave to be measured, if it is a continuous wave, the changeover switch 45 is connected to the amplifier 18 via contact m, the switches 28 and 35 are turned ON (closed), the switch 47 is turned OFF (opened) and the detecting characteristic changeover knob 22 is set to the mean value detecting position M. These switches and the knob 22 may also be ganged to each other. The output from the sawtooth signal generator 27 is provided via switch 28 and the adder circuit 29 to a control terminal of the local oscillator 16 to sweep its frequency, resulting in the frequency of the received wave being swept. Upon receipt of the wave to be measured, such a waveform 49 (as shown in FIG. 4) appears on the CRT display 21. The control signal generator 31 is adjusted so that the center of the waveform 49 coincides with the center of the abscissa of the screen. Further, the variable attenuator 13 or/and the variable gain amplifier 18 are adjusted to bring the peak value of the waveform 49 into agreement with the reference level 51. At this time, signals indicating these set values are applied to the adder 36 from the set value signal generators 37 and 41. At the same time, a signal indicating the frequency of the input wave is provided from the control signal generator 31 via switch 35 to the compensating signal generator 34, which, in turn, supplies the adder 36 with a compensating signal corresponding to the frequency of the input wave. As a consequence, the frequency characteristic of the antenna 11 is also compensated, with the result that an input level corresponding to the reference level 51 of the first display 21 is displayed on the second display 48. In other words, the electric field intensity of the wave to be measured at that time is displayed on the second display 48.

The peak value of the waveform 49 (FIG. 4) need not always be brought into agreement with the reference level 51. As the electric field intensity corresponding to the reference level 51 is available from the display provided on the second display 48, the electric field intensity of the received wave can be obtained by reading the ratio of the peak value of the waveform 49 to the reference level 51 from the scale of the CRT display 21.

As will be seen from the above, the electric field intensity measuring equipment shown in FIG. 3 is very simple in manipulation. In the conventional arrangement depicted in FIG. 1, the switch 12 is changed to the position connected to the reference oscillator 23, and the inputs from the antenna 11 and the reference oscillator 23 are thus level adjusted in separate operations. In contrast, in the embodiment of FIG. 3, the level adjustment may be accomplished in a single operation. On top of that, in the prior art, the compensation for the frequency characteristic of the antenna involves reading of a graph and a calculation. However, in the embodiment of FIG. 3, the compensation is automatically achieved by the compensating signal generator 34. Further, in accordance with the invention, the frequency of the local oscillator 16 can be regulated to correctly correspond to the frequency of the input electric wave by the frequency sweep with the output from the sawtooth signal generator 27, and by adjusting the control signal generator 31 while observing the frequency spectrum of the input electric wave on the CRT display 21. Accordingly, the frequency adjustment for the received electric wave is also easier in the present invention, as contrasted with the conventional apparatus of FIG. 1. In the case of using the CRT display 21, not only the center frequency of the electric wave to be measured but also its sideband components are simultaneously displayed; therefore, the properties of the electric wave can also be known. The center frequency at this time is measured by the frequency measuring device 54.

In the event of measuring the electric field intensity of a noise wave, the switch 45 is connected to the contact q, the knob 22 is switched to the quasi-peak value detecting position Q, the switch 28 is turned OFF (opened), and the switches 35 and 47 are turned ON (closed). It is preferred that they are placed in a ganged relation, as mentioned previously. In this instance, after being frequency converted, a received noise wave is amplified by the variable gain amplifier 18 and then provided via the auxiliary amplifier 44 to the detector 19. Since the detector 19 is set to be in the quasi-peak value detecting mode of operation, its output level is reduced lower than that in the case of the mean value detection mode. However, the auxiliary amplifier 44 compensates for the reduced output level of the detector 19. That is, the auxiliary amplifier 44 serves to provide the same display on the CRT display 21 for the same output from the variable gain amplifier 18 in both the mean value detection mode and the quasi-peak value detection mode. By the insertion of the auxiliary amplifier 44, the antenna input level becomes low with respect to the same display level; but a signal corresponding to the gain of the auxiliary amplifier 44 is applied from the terminal 46 via the switch 47 to the adder 36, thereby compensating the display on the second display 48. Consequently, the electric field intensity of a noise wave can also be measured in the same manner as set forth previously with respect to the measurement of the electric field intensity of the continuous wave.

In the case of conducting measurement with the detector 19 set to the quasi-peak value detection mode but with the switch 45 held to the position of the contact m, if a maximum permissible input level of the stage preceding the detector 19 is assumed to be 110 dBµ when the first display 21 has the reference level, (for example, its maximum level in the state of the attenuation of the attenuator 13 is zero and the gain of the variable amplifier 18 is maximum), and if the overload factor of the stage preceding the detector 19 is assumed to be 40 dBµ when the first display 21 has the reference level in the mean value detection mode of the detector 19, measurement by the mean value detection mode is possible only up to 70 dBµ in the prior art. With the embodiment of FIG. 3, however, the auxiliary amplifier 44 is employed in the quasi-peak value detection mode, so that, in the case of the mean value detection also measurement can be achieved up to the maximum permissible level of the stage preceding the detector 19; in this case, the antenna input can be measured up to 110 dBµ. Thus, it is possible to make effective use of the maximum permissible level of the stage preceding the detector 19; therefore, the measurable dynamic range of the input is enlarged as a result. In the quasi-peak value detection mode the limit of the measurable input is reduced to 70 dBµ corresponding to the insertion of the auxiliary amplifier 44.

In the measurement of the electric field intensity of a noise wave, since the first display 21 is swept by the output from the sawtooth signal generator 27, the peak value of the output from the detector 19 appears as a bright line parallel to the abscissa on the display 21. Where the display is provided in dB on the first display 21, the output from the variable gain amplifier 18 is detected, for example, after being subjected to logarithmic amplification, and is then supplied to the display 21. In this case, one part of a logarithmic amplifier may also be used to perform the function of the auxiliary amplifier 44.

Figure 5:
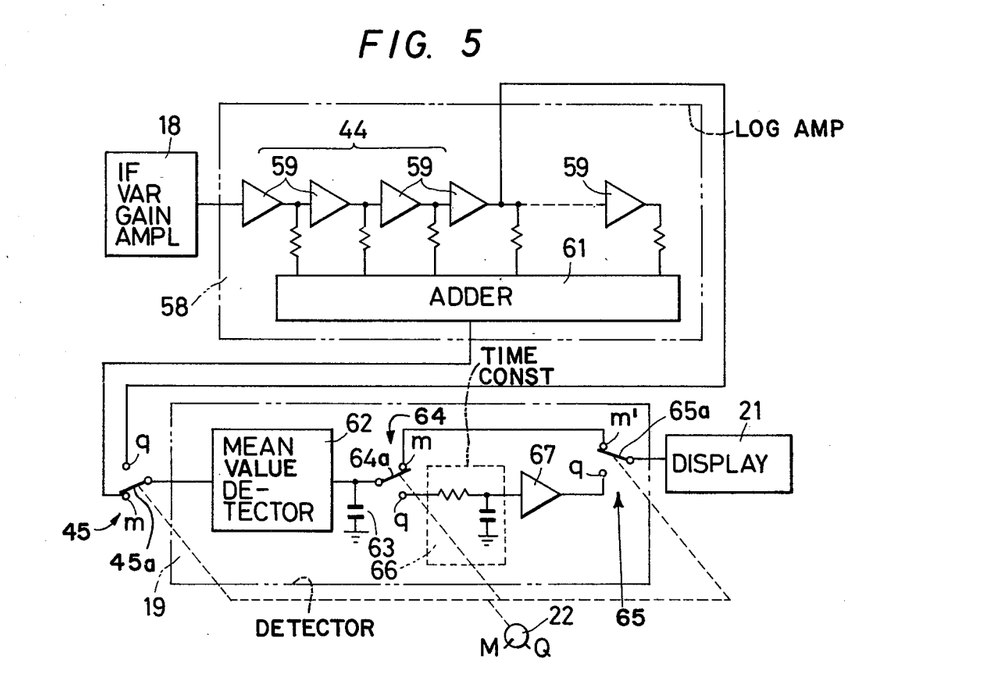
FIG. 5 is a block diagram illustrating an example in which a logarithmic amplifier is partly used as an auxiliary amplifier 44 of FIG. 3, and also a specific operative example of one portion of a detector 19.

For instance, as shown in FIG. 5, a logarithmic amplifier 58 is disposed on the output side of the variable gain amplifier 18. The logarithmic amplifier 58 is composed of a cascaded connection of amplifying stages 59 of a constant gain, for instance, 10 dB. The outputs from the amplifying stages 59 are added together by an adder circuit 61, and its added output is applied as the output from the logarithmic amplifier 58 to the contact m of the switch 45. To the input side of a first one of the cascade-connected amplifying stages 59, there is provided the output from the variable gain amplifier 18. In this manner, the logarithmic amplifier 58 is formed, and a certain number of the amplifying stages 58 as counted from the first one of them, corresponding to the gain needed for the auxiliary amplifier 44, function as the amplifier 44. For example, in the case where the required gain is 40 dB and the gain of each amplifying stage is 10 dB, the first to fourth amplifying stages are employed to perform the function of the auxiliary amplifier 44, and the output side of the fourth stage is connected to the contact q of the changeover switch 45. In this way, one portion of the logarithmic amplifier 58 is utilized as the auxiliary amplifier 44.

In the detector 19, the movable member 45a of the changeover switch 45 is connected to one end of a mean value detector 62, including a detecting element such as a diode (not shown) and the other end of the mean value detector 62 is grounded via a by-pass capacitor 63, through which carrier components are grounded. The output side of the mean value detector 62 is connected to a movable member 64a of a changeover switch 64, the contact m of which is connected directly to a contact m of a switch 65, the contact q of which is connected via a time constant circuit 66 and a DC logarithmic amplifier 67 to a contact q of the switch 64. The charge and discharge time constants of the time constant circuit 66 are selected so that a quasi-peak value detected output is yielded. The switches 64 and 65 are controlled by the detecting characteristic changeover knob 22 and are both changed over to the contacts m or q at the same time; when the knob 22 is set to the mean value detecting position M, the movable switch members 64a and 65a are connected to the respective contacts m. When the knob 22 is set to the mean value detecting position M, the output from the variable gain amplifier 18 is logarithmically amplified and provided via the contact m of the switch 45 to the detector 19 for the mean value detection, and resulting detected output is supplied to the display 21, which displays the magnitude in dB. When the knob 22 is switched to the quasi-peak value detecting position Q, the output from the variable gain amplifier 18 is linearly amplified by the first to fourth amplifying stages 59 of the logarithmic amplifier 58, and is then provided via the contact q of the switch 45 to the detector 19. In the detector 19 the linearly amplified input is applied via switch 64 (contact q) to the time constant circuit 66 so as to permit quasi-peak value detection, and the detected output is logarithmically amplified by the DC logarithmic amplifier 67 and then supplied via switch 65 (contact q) to the display 21 which displays the magnitude in dB.

It is possible not only for an AC amplifier to be employed as the auxiliary amplifier 44 and inserted immediately before the detector 19, but also for a DC amplifier to be connected to or disconnected from the stage following the detector 19, as required. In the latter case, the detector 19 is required to be operable at relatively low levels. The auxiliary amplifier 44 is provided at a stage following the frequency converter 15 because it is usually difficult to raise the maximum allowable level of input to the frequency converter 15.

Figure 6:
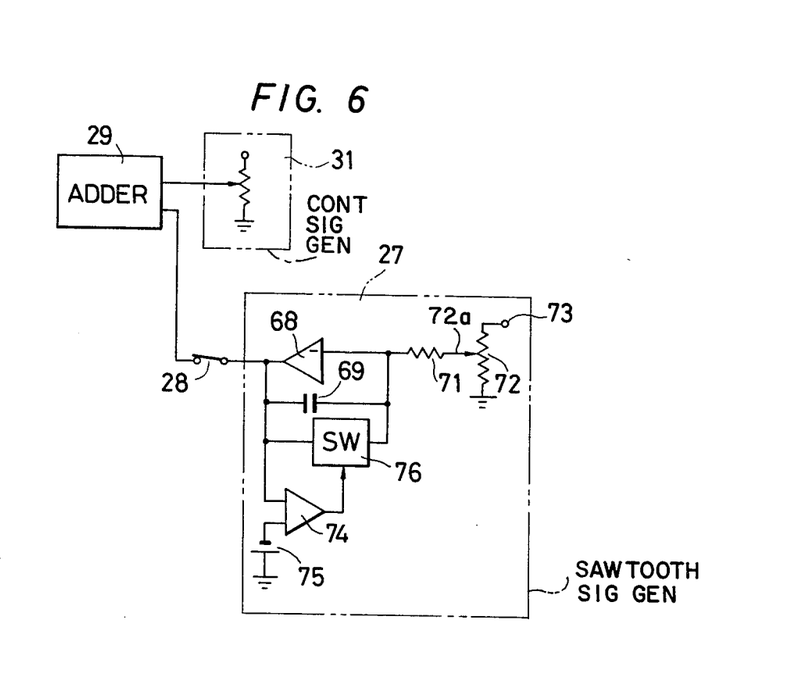
FIG. 6 is a diagram showing means for adjusting the sweep speed of a sweep signal generator.

In the above, referring back to FIG. 3, in the quasi-peak value detection mode, that is, in the measurement of the electric field intensity of a noise wave, the sawtooth signal generator 27 is disconnected by the switch 28 from the adder circuit 29, but it is also possible to greatly decrease the speed of change in the sawtooth signal from the sawtooth signal generator 27, with the switch 28 being still retained in its ON (closed) stage. For example, as depicted in FIG. 6, the sawtooth signal generator 27 is formed as an integrator employing an operational amplifier 68. Namely, an integrating capacitor 69 is connected between the inverted input and output sides of the operational amplifier 68, and the inverted input side is connected via a resistor 71 to a movable member 72a of a variable resistor 72. The variable resistor 72 is connected at one end to a power source terminal 73 and is grounded at the other end.

The output side of the operational amplifier 68 is connected via the switch 28 to the adder 29, and to the side of the CRT display 21, as illustrated in FIG. 3. The output from the operational amplifier 68 is provided to a comparator 74 for comparison with a reference value from a reference power source 75. By means of the operational amplifier 68 and a capacitor 69, a constant voltage corresponding to a set value of the movable member 72a of the variable resistor 72 is integrated. When the integrated output becomes larger in absolute value than the reference voltage of the power source 75, a switch 76 connected between both ends of the integrating capacitor 69 is controlled by the output from the comparator 74 to short the integrating capacitor 69; namely, resetting and setting of the integration is repeated to thereby produce a sawtooth signal. In the case where the knob 22 is set to the quasi-peak value detecting position Q, the variable resistor 72 is adjusted, that is, a voltage available at the movable member 72a of the variable resistor 72 is decreased in absolute value to markedly reduce the inclination of the sawtooth wave of the integrated output, thereby causing the oscillation frequency of the local oscillator 16 (FIG. 3) to change very slowly. With such an arrangement, it is possible to leave out the switch 28 and to apply the output from the sawtooth signal generator 27 directly to the adder circuit 29. When the knob 22 is set to the mean value detecting position M, the voltage obtainable at the movable member 72a of the variable resistor 72 is made large so as to increase the inclination of the sawtooth signal, thereby raising the frequency sweep speed of the local oscillator 16.

Figure 7:
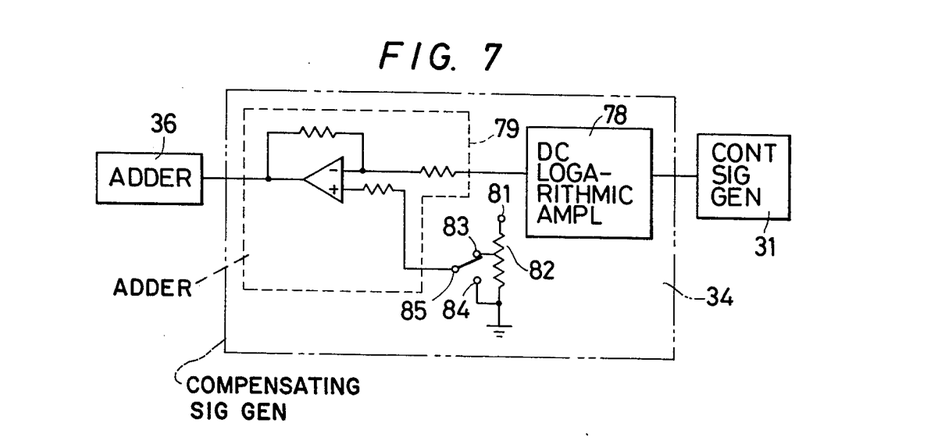
FIG. 7 is a diagram illustrating another embodiment of this invention which employs a logarithmic amplifier as a compensating signal generator 34 of FIG. 3, and which is adapted to add a constant value to the output from the logarithmic amplifier in accordance with an antenna used.

As referred to previously, for instance, a logarithmic amplifier can be employed as the compensating signal generator 34 (FIG. 3). The logarithmic amplifier can be used with a dipole antenna and a log periodic antenna; but the gain of the former is smaller than that of the latter by about 5 dB. Accordingly, for example, as shown in FIG. 7, the output from the control signal generator 31 is applied, in the compensating signal generator 34, to a DC logarithmic amplifier 78 which has a logarithmic input/output characteristic, and its output is provided to one input side of an adder circuit 79. Between a terminal 81 and the ground, there is connected a potentiometer 82, whose voltage dividing terminal 83 and grounding terminal 84 are switchably connectable by a switch 85 to the other input of the adder circuit 79. Where the log periodic antenna is employed, the switch 85 is connected to the terminal 84, and when the dipole antenna is used, the switch 85 is connected to the terminal 83. A certain value, for instance, about 5 dB, is added to the output of the DC logarithmic amplifier 78, and the added output is supplied to the adder 36. By such selective changeover of the switch 85 in dependence upon whether the antenna 11 is a dipole antenna or a log periodic antenna, the compensating signal generator 34 can be employed in common with both of them. In addition to the antenna 11, a rod antenna, a loop antenna, etc. can also be used. In this case, the frequency characteristic of the antenna used does not always become a logarithmic characteristic, but the purpose can be attained by producing a similar compensating signal by means of the employment of a function generator having an input/output characteristic corresponding to the frequency characteristic, that is, by employing a so-called linearizer.

In the arrangement of FIG. 3, if the electric field intensity of a noise wave is not measured, the auxiliary amplifier 44 and the changeover switch 45 are omitted; the output of the amplifier 18 is connected directly to the detector 19; the detecting characteristic changeover knob 22 is omitted; and a detector effecting only the mean value detection is employed as the detector 19. Moreover, the switch 28 is also omitted and the output from the sawtooth signal generator 27 is applied directly to the adder circuit 29. The terminal 46 and the switch 47 are also omitted and only the outputs from the set signal generators 37 and 41 and the compensating signal generator 34 are provided to the adder 36.

Further, in FIG. 3, for eliminating the reception of an image signal in the frequency conversion, a so-called "up converter" is used as the frequency converter 15, by means of which a frequency signal equal to the sum of the oscillation frequency of the local oscillator 16 and the frequency of the output signal of the high-frequency amplifier 14 is obtained. The frequency of the converted output is lowered by a one- or two-stage "down converter," and is then supplied to the amplifier 17 or the variable gain amplifier 18. This method is often carried into practice in the art, and the embodiment of FIG. 3 can also be adapted for such operation.

As described previously, the apparatus shown in FIG. 3 can also be employed as a frequency spectrum analyzer, in which case the connector 25 is disconnected from the cable 26, the source of the input signal to be measured is connected to the connector 25, and the switch 35 is turned off. In other words, in the measurement of the input electric field intensity, as well not only the electric field intensity but also the frequency spectrum of the input wave can be simultaneously measured; therefore, the properties of the electric wave can be known.

The set signal generators 37 and 41 are described to yield DC set signals but may also be adapted to generate digital signals. In this instance, the so-called "code plate" of a disc-like configuration is rotated, for example, by turning a knob of the variable attenuator 13 to obtain binary code signals of a plurality of parallel bits corresponding to the rotational position of the "code plate." It is also possible to adopt such a similar arrangement that a code plate of binary codes is rotated by turning a gain control knob of the variable gain amplifier 18 to yield a parallel binary code signal corresponding to the set gain of the amplifier 18. In this case, the adder 36 is required to be a binary adder; therefore, the compensating signal must also be converted to digital form. This can be achieved, for example, by converting the DC output from the control signal generator 31 by an A-D converter to a digital signal, or by providing a "code plate" in ganged relation to the control knob of the variable resistor 33 so as to derive therefrom a parallel binary code signal corresponding to the control signal, and by arranging the compensating signal generator 34 in the form of a read-only memory which has prestored therein, as a digital code signal, a compensating signal corresponding to the control signal, and from which the digital compensating signal is read out by the abovesaid binary code signal. Where the adder 36 is a digital one, its output is applied directly to the digital display 53; but it is also possible to employ an analog signal as the compensating signal generator 34, and to apply the analog output therefrom to the digital adder 36 after conversion to digital form.

The frequency of an electric wave may be measured from the output of the control signal generator 31, as described previously, but as the frequency of the output from the intermediate-frequency amplifier 17 or the oscillation frequency of the local oscillator 16 corresponds to the frequency of an input electric wave to be measured, the measurement may also be conducted by counting these frequencies. Further, in the foregoing, the display 21 was described as a CRT display however, it may also be a meter-type display or indicator, in which case the output from the sawtooth signal generator 27 is not supplied to the display 21. The second display 48 may also be a meter-type display.

It will be apparent that many modifications and variations may be effected without departing from the scope of novel concepts of this invention.

What is claimed is:

1. An electric field intensity measuring apparatus for measuring, in accordance with a reference level, the electric field intensity of an input signal received by an antenna, said input signal having an input signal level, said apparatus comprising:

first level adjuster means supplied with said input signal from said antenna for adjusting the input signal level in accordance with a first set value provided thereto to produce a first level adjusted output;

variable frequency local oscillator means for generating an oscillator output signal having an oscillation frequency which is controlled by a control signal provided as an input to said variable frequency local oscillator means;

frequency converter means for receiving said first level adjusted output and said oscillator output signal, and for frequency mixing the first level adjusted output and the oscillator output signal to provide a signal of a constant frequency as a converted output having a level;

second level adjuster means supplied with the converted output from the frequency converter means for adjusting said level of said converted output in accordance with a second set value to produce a second level adjusted output;

detector means for detecting said second level adjusted output to produce a detected output having a magnitude;

first display means supplied with the detected output from the detector means for displaying an indication of said magnitude of said detected output, said magnitude of said detected output approaching said reference level;

control signal generator means for supplying to said variable frequency local oscillator means said control signal for controlling said oscillation frequency of said oscillator output signal in accordance with a control signal set value provided to said control signal generator means;

first set signal generator means for generating a first set signal indicating said first set value provided to said first level adjuster means;

second set signal generator means for generating a second set signal indicating said second set value provided to said second level adjuster means;

compensating signal generator means supplied with a signal corresponding to said control signal set value to produce a compensating signal for compensating the frequency characteristic of the antenna;

adder means for receiving and adding together the first set signal, the second set signal and the compensating signal to produce an added output having a magnitude; and second display means supplied with the added output from the adder means for displaying an indication of said magnitude of said added output, whereby to display said measured electric field intensity of said input signal when said magnitude of said detected output reaches said reference level.

2. An electric field intensity measuring apparatus according to claim 1, wherein the first level adjuster means comprises a variable attenuator whose output level is adjusted by turning a first knob, wherein the second level adjuster means comprises a variable gain amplifier whose output level is adjusted by turning a second knob, wherein the first set signal generator means comprises a first variable resistor having a first variable resistance, means for applying a first voltage to said first variable resistor, and means for adjusting said first variable resistance of said first variable resistor in accordance with the turning of the first knob of the first level adjuster means for producing a first DC signal comprising said first set signal, wherein the second set signal generator means comprises a second variable resistor having a second variable resistance, means for applying a second voltage to said second variable resistor, and means for adjusting said second variable resistance of said second variable resistor in accordance with the turning of the second knob of the second level adjuster means for producing a second DC signal comprising said second set signal, wherein the compensating signal generator means produces an analog compensating signal, and wherein the adder means comprises an analog adder.

3. An electric field intensity measuring apparatus according to claim 1, wherein the control signal generator means comprises a variable control resistor having a variable control resistance, means for applying a control voltage to said variable control resistor, and means for adjusting said variable control resistance of said variable control resistor to provide a DC control signal, and wherein the compensating signal generator means comprises a DC logarithmic amplifier, and means for supplying the DC control signal to said logarithmic amplifier, whereby to provide as an output a logarithmic input/output characteristic.

4. An electric field intensity measuring apparatus according to claim 3, said compensating signal generator means comprising an adder circuit having one input side and another input side, said DC logarithmic amplifier having an output side, said one input side of an adder circuit being connected to the output side of the DC logarithmic amplifier, said compensating signal generator means further comprising a voltage generator for producing a plurality of DC voltages respectively corresponding to gains of a plurality of usable antennas, switch means for selecting one of said DC voltages in accordance with the gain of the antenna used, and means for providing said selected one of said DC voltages to said another input of the adder circuit.

5. An electric field intensity measuring apparatus according to claim 1, wherein the first set signal generator means comprises means for generating a digital first set signal, wherein the second set signal generator means comprises means for generating a digital second set signal, said apparatus further comprising an A-D converter for receiving and converting the compensating signal from the compensating signal generator means to a digital compensating signal, said adder means comprising a digital adder.

6. An electric field intensity measuring apparatus according to claim 1, wherein the first set signal generator means comprises means for generating a digital first set signal, wherein the second set signal generator means comprises means for generating a digital second set signal, said apparatus further comprising an A-D converter for receiving and converting the control signal from the control signal generator means to a digital control signal, and wherein the compensating signal generator means comprises a memory for storing digital data representing digital compensating signals, and means responsive to said digital control signal for addressing said memory to read out the digital data, whereby to provide said digital compensating signal.

7. An electric field intensity measuring apparatus according to claim 1, wherein the second display means comprises a digital display.

8. An electric field intensity measuring apparatus according to claim 1, wherein said electric field intensity measuring apparatus has a mean value detecting mode and a quasi-peak value detecting mode, and wherein the detector means has charge and discharge time constants, said detector means comprising a detecting characteristic changeover knob for switchably selecting one of said mean value detecting mode and said quasi-peak value detecting mode, and means responsive to selection of said quasi-peak value detecting mode for connecting an auxiliary amplifier in said apparatus at a stage following the frequency converter means and for applying a signal indicating the gain of the auxiliary amplifier to the adder means.

9. An electric field intensity measuring apparatus according to claim 8, wherein the auxiliary amplifier is an AC amplifier connected between the second level adjuster means and the detector means.

10. An electric field intensity measuring apparatus according to claim 8, further comprising a logarithmic amplifier between the second level adjuster means and the detector means, said logarithmic amplifier comprising a plurality of cascade-connected amplifying stages of the same gain producing respective outputs, and circuit means for adding the respective outputs of the amplifying stages, a selected number from a first one to an intermediate one of the cascade-connected amplifying stages comprising said auxiliary amplifier, said apparatus further comprising switch means for selectively applying the output from the intermediate one of said amplifying stages and the output from the logarithmic amplifier to the detector means in accordance with its selected detecting mode.

11. An electric field intensity measuring apparatus according to claim 1, further comprising sweep signal generator means for generating a sweep signal, adder circuit means for adding said sweep signal from the sweep signal generator means and the control signal from the control signal generator means to produce an added output, and means for applying the added output as a frequency control signal to the variable frequency local oscillator means, said first display means comprising a CRT display, said detected output from the detector means and the sweep signal comprising a vertical deflection signal and a horizontal deflection signal, respectively, applied to said CRT display.

12. An electric field intensity measuring apparatus according to claim 11, wherein said electric field intensity measuring apparatus has a mean value detecting mode and a quasi-peak value detecting mode, and wherein the detector means has charge and discharge time constants, said detecting means comprising a detecting characteristic changeover knob for switchably selecting one of said means value detection mode and said quasi-peak value detection mode, said apparatus comprising means responsive to selection of said quasi-peak value detecting mode for connecting an auxiliary amplifier having a gain in said apparatus at a stage following the frequency converter means, means for supplying a signal indicating the gain of the auxiliary amplifier to the adder means, and switch means for cutting off the input of said sweep signal from the sweep signal generator means to the adder circuit means.

13. An electric field intensity measuring apparatus according to claim 11, wherein said electric field intensity measuring apparatus has a mean value detecting mode and a quasi-peak value detecting mode, and wherein the detector means has charge and dicharge time constants, said detecting means comprising a detecting characteristic knob for switchably selecting between said mean value detection mode and said quasi-peak value detection mode, said apparatus comprising means responsive to the detecting characteristic changeover knob being switched to the quasi-peak value detecting mode for inserting an auxiliary amplifier having a gain in said apparatus at a stage following the frequency converter means, means for applying a signal indicating the gain of the auxiliary amplifier to the adder means, and means for decreasing the sweep speed of the sweep signal generator means.

14. An electric field intensity measuring apparatus according to claim 1, further comprising means for measuring the frequency of the input signal.

15. An electric field intensity measuring apparatus according to claim 14, wherein the frequency measuring means converts the control signal of the control signal generator means to a digital signal for display.

16. An electric field intensity measuring apparatus for measuring, in accordance with a reference level, the electric field intensity of an input signal received by an antenna, said input signal having an input signal level, said apparatus comprising:

first level adjuster means supplied with said input signal from said antenna for adjusting the input signal level in accordance with a first set value provided thereto to produce a first level adjusted output;

variable frequency local oscillator means for generating an oscillator output signal having a variable oscillation frequency;

frequency converter means for receiving said first level adjusted output and said oscillator output signal, and for frequency mixing the first level adjusted output and the oscillator output signal to provide a signal of a constant frequency as a converted output having a level;

second level adjuster means supplied with the converted output from the frequency converter means for adjusting said level of said converted output in accordance with a second set value to produce a second level adjusted output;

detector means for detecting said second level adjusted output to produce a detected output having a magnitude;

first display means supplied with the detected output from the detector means for displaying an indication of said magnitude of said detected output, said magnitude of said detected output approaching said reference level;

first set signal generator means for generating a first set signal indicating said first set value provided to said first level adjuster means;

second set signal generator means for generating a second set signal indicating said second set value provided to said second level adjuster means;

adder means for receiving and adding together the first set signal and the second set signal to produce an added output having a magnitude; and second display means supplied with the added output from the adder means for displaying an indication of said magnitude of said added output, whereby to display said measured electric field intensity of said input signal when said magnitude of said detected output reaches said reference level;

said apparatus further comprising compensating signal generator means for generating a compensating signal for compensating the frequency characteristic of the antenna.

17. An electric field intensity measuring apparatus according to claim 16, wherein the first level adjuster means comprises a variable attenuator whose output level is adjusted by turning a first knob, wherein the second level adjuster means comprises a variable gain amplifier whose output level is adjusted by turning a second knob, wherein the first set signal generator means comprises a first variable resistor having a first variable resistance, means for applying a first voltage to said first variable resistor, and means for adjusting said first variable resistance of said first variable resistor in accordance with the turning of the first knob of the first level adjuster means for producing a first DC signal comprising said first set signal, wherein the second set signal generator means comprises a second variable resistor having a second variable resistance, means for applying a second voltage to said second variable resistor, and means for adjusting said second variable resistance of said second variable resistor in accordance with the turning of the second knob of the second level adjuster means for producing a second DC signal comprising said second set signal.

18. An electric field intensity measuring apparatus according to claim 16, wherein the first set signal generator means comprises means for generating a digital first set signal, wherein the second set signal generator means comprises means for generating a digital second set signal, said adder means comprising a digital adder.

19. An electric field intensity measuring apparatus according to claim 16, wherein the second display means comprises a digital display.

20. An electric field intensity measuring apparatus according to claim 16, wherein said electric field intensity measuring apparatus has a mean value detecting mode and a quasi-peak value detecting mode, and wherein the detector means has charge and discharge time constants, said detector means comprising a detecting characteristic changeover knob for switchably selecting one of said mean value detecting mode and said quasi-peak value detecting mode, and means responsive to selection of said quasi-peak value detecting mode for inserting an auxiliary amplifier in said apparatus at a stage following the frequency converter means and for applying a signal indicating the gain of the auxiliary amplifier to the adder means.

21. An electric field intensity measuring apparatus according to claim 20, wherein the auxiliary amplifier is an AC amplifier connected between the second level adjuster means and the detector means.

22. An electric field intensity measuring apparatus according to claim 20, further comprising a logarithmic amplifier between the second level adjuster means and the detector means, said logarithmic amplifier comprising a plurality of cascade-connected amplifying stages of the same gain producing respective outputs, and circuit means for adding respective outputs of the amplifying stages, a selected number from first one to an intermediate one of the cascade-connected amplifying stages comprising said auxiliary amplifier, said apparatus further comprising switch means for selectively applying the output from the intermediate one of said amplifying stages and the output from the logarithmic amplifier to the detector means in accordance with its selected detecting mode.

23. An electric field intensity measuring apparatus according to claim 16, further comprising means for measuring the frequency of the input signal.

24. An electric field intensity measuring apparatus according to claim 23, wherein the frequency measuring means converts the control signal of the control signal generator means to a digital signal for display.

25. An electric field intensity measuring apparatus according to claim 16, wherein said variable frequency local oscillator means is controlled, as to its oscillation frequency, by a control signal provided as an input to said variable frequency local oscillator means, said apparatus further comprising control signal generator means for supplying to said variable frequency local oscillator means said control signal for controlling said oscillation frequency of said oscillator output signal in accordance with a control signal set value provided to said control signal generator means.

* * * * *

UNITED STATES PATENT AND TRADEMARK OFFICE
CERTIFICATE OF CORRECTION

PATENT NO. : 4,272,719

DATED : June 9, 1981

INVENTOR(S) : Niki et al.

It is certified that error appears in the above—identified patent and that said Letters Patent is hereby corrected as shown below:

Fig. 3 of the drawings, "SET." should be --SET--;

Col. 2, line 58, after "display" (first occurrence) insert --,--;

Col. 6, line 35, "m and q" should be --$\underline{m}$ and $\underline{q}$--;

line 49, after "compensation" insert --,--;

Col. 7, line 48, "m" should be --$\underline{m}$--;

line 50, after "(opened)" insert --,--;

Col. 8, line 52, "q" should be --$\underline{q}$--;

Col. 9, line 13, "m" should be --$\underline{m}$--;

line 16, after "level" delete ",";

line 27, after "also" insert --,--;

line 34, after "mode" insert --,--;

line 56, "m" should be --$\underline{m}$--;

line 61, "58" should be --59--;

UNITED STATES PATENT AND TRADEMARK OFFICE
CERTIFICATE OF CORRECTION

PATENT NO. : 4,272,719
DATED : June 9, 1981
INVENTOR(S) : Niki et al.

It is certified that error appears in the above—identified patent and that said Letters Patent is hereby corrected as shown below:

Col. 10, line 1, "q" should be --$\underline{q}$--;

line 7, after "shown)" insert --,--;

line 12, "m" should be --$\underline{m}$--;

line 13, "m" should be --$\underline{m}$--, and "q" should be --$\underline{q}$--;

line 15, "q" should be --$\underline{q}$--;

line 20, "m" should be --$\underline{m}$--;

line 21, "q" should be --$\underline{q}$--;

line 24, "m" should be --$\underline{m}$--;

line 27, "m" should be --$\underline{m}$--;

line 28, delete "the", and after "and" insert --the--;

line 34, "q" should be --$\underline{q}$--;

line 35, after "19" (second occurrence) insert --,--;

line 37, "q)" should be --$\underline{q}$)--;

line 40, "q)" should be --$\underline{q}$)--;

UNITED STATES PATENT AND TRADEMARK OFFICE
CERTIFICATE OF CORRECTION

PATENT NO. : 4,272,719

DATED : June 9, 1981

INVENTOR(S) : Niki et al.

It is certified that error appears in the above—identified patent and that said Letters Patent is hereby corrected as shown below:

Col. 12, line 6, after "omitted" insert --,--;

line 9, after "omitted" insert --,--;

line 30, "intensity, as well" should be --intensity as well,--;

Col. 13, line 6, after "display" (second occurrence) insert -- ; --.

Signed and Sealed this

Twelfth Day of October 1982

[SEAL]

Attest:

GERALD J. MOSSINGHOFF

Attesting Officer     Commissioner of Patents and Trademarks